(12) United States Patent
Waltrich

(10) Patent No.: US 11,324,142 B2
(45) Date of Patent: May 3, 2022

(54) ARRANGEMENT OF ELECTRICAL MODULES, CONVERTER AND AIRCRAFT WITH SUCH AN ARRANGEMENT, AND METHOD FOR PRODUCING THE ARRANGEMENT

(71) Applicant: Rolls-Royce Deutschland Ltd & Co KG, Blankenfelde-Mahlow (DE)

(72) Inventor: Uwe Waltrich, Erlangen (DE)

(73) Assignee: Rolls-Royce Deutschland Ltd & Co KG, Blankenfelde-Mahlow (DE)

( * ) Notice: Subject to any disclaimer, the term of this patent is extended or adjusted under 35 U.S.C. 154(b) by 0 days.

(21) Appl. No.: 17/053,758

(22) PCT Filed: Apr. 24, 2019

(86) PCT No.: PCT/EP2019/060489
§ 371 (c)(1),
(2) Date: Nov. 6, 2020

(87) PCT Pub. No.: WO2019/214944
PCT Pub. Date: Nov. 14, 2019

(65) Prior Publication Data
US 2021/0219456 A1    Jul. 15, 2021

(30) Foreign Application Priority Data

May 7, 2018    (DE) .................... 10 2018 207 033.4

(51) Int. Cl.
*H05K 7/20*    (2006.01)
*B64D 27/24*    (2006.01)
(Continued)

(52) U.S. Cl.
CPC ........... *H05K 7/2049* (2013.01); *B64D 27/24* (2013.01); *B64D 33/10* (2013.01); *H01L 23/40* (2013.01); *H05K 7/209* (2013.01)

(58) Field of Classification Search
CPC .......... H01L 23/34–4735; B64D 27/24; B64D 33/10; H05K 7/2039; H05K 7/20409; H05K 7/20509; H05K 7/209
See application file for complete search history.

(56) References Cited

U.S. PATENT DOCUMENTS 5,909,358 A * 6/1999 Bradt ................... H01L 23/4093
361/707
6,431,259 B2 * 8/2002 Hellbruck ........... H01L 23/4093
165/185
(Continued)

FOREIGN PATENT DOCUMENTS

DE    102011076879 A1    2/2012
DE    102015114341 A1    3/2016
(Continued)

OTHER PUBLICATIONS

German Office Action for German Application No. 10 2018 207 033.4 dated Dec. 20, 2018.
(Continued)

*Primary Examiner* — Zachary Pape
(74) *Attorney, Agent, or Firm* — Lempia Summerfield Katz LLC

(57) ABSTRACT

The invention specifies an arrangement having at least one electrical module (2) which is arranged on a heat sink (3). The arrangement has: —first deflection elements (4) which are formed in or on the electrical module (2), —second deflection elements (5) which are formed in or on the heat sink (3), and—at least one flexible, cable- or strip-like tensioning element (1), —which is arranged between the first and second deflection elements (4, 5) under tension (F) in such a way that the electrical module (2) is pressed onto the heat sink (3). A converter and an aircraft having an
(Continued)

arrangement of this kind and also a method for producing an arrangement of this kind are likewise specified.

15 Claims, 2 Drawing Sheets

(51) Int. Cl.
*B64D 33/10* (2006.01)
*H01L 23/40* (2006.01)

(56) References Cited

U.S. PATENT DOCUMENTS

| | | | |
|---|---|---|---|
| 6,522,545 B2* | 2/2003 | Shia | H01L 23/4093 24/458 |
| 7,515,419 B2* | 4/2009 | Li | H01L 23/4093 165/80.3 |
| 2013/0105112 A1* | 5/2013 | Gan | F28F 3/06 165/67 |
| 2019/0152617 A1* | 5/2019 | Anton | H02P 17/00 |

FOREIGN PATENT DOCUMENTS

| | | |
|---|---|---|
| JP | H11284125 A | 10/1999 |
| JP | 2013207199 A | 10/2013 |
| JP | 2015225940 A | 12/2015 |

OTHER PUBLICATIONS

International Search Report and the Written Opinion for International Patent Application PCT/EP2019/060489 dated Aug. 9, 2019.

* cited by examiner

ARRANGEMENT OF ELECTRICAL MODULES, CONVERTER AND AIRCRAFT WITH SUCH AN ARRANGEMENT, AND METHOD FOR PRODUCING THE ARRANGEMENT

This application is the National Stage of International Application No. PCT/EP2019/060489, filed Apr. 24, 2019, which claims the benefit of German Patent Application No. DE 10 2018 207 033.3, filed May 7, 2018. The entire contents of these documents are hereby incorporated herein by reference.

FIELD

The present embodiments relate to an arrangement including an electrical module that is arranged on a heat sink, a power converter including such an arrangement, and an aircraft to the power converter. The present embodiments also relate to a method for producing an arrangement of this kind.

BACKGROUND

Power modules (e.g., modules with power semiconductors) for, for example, power converters or other electrical modules that are subject to power loss are often pressed onto heat sinks. Thermally conductive pastes or thermally conductive foils are used to compensate for the deformation, sagging, or roughness between the two contact partners (e.g., heat sink and power module).

When a number of power modules are connected in parallel on a single heat sink, the modules are generally held down with the help of a common clamping frame. A distance between the power modules and fastening points of the clamping frame is usually different for reasons of design. As a result of this, different contact forces act on the individual power modules. In order to achieve the most uniform pressing possible, a high level of mechanical effort is to be provided. This increases a total weight of the system.

Different contact forces or pressures on the power modules lead to different thermal resistances. This results in non-uniform distribution of current and, therefore, non-uniform loading on the power modules. This reduces the overall efficiency and reduces the service life of an overall system (e.g., of a converter).

In order to compensate for these height and position tolerances, pressure compensation materials (e.g., silicone mats) are nowadays used between the power modules and the clamping frame. However, different distances between the power modules and the screw connection points of the clamping frame result in different resulting forces on the power modules. Uniform distribution of forces may only be achieved with a high level of complexity in terms of design, where 100% uniform pressing on the individual power modules cannot be guaranteed by known clamping frame concepts.

In summary, the following problems arise: high costs and high level of technical complexity; oversizing due to identical power modules being connected in parallel; a higher weight due to the high level of complexity in terms of design; and a larger volume (e.g., installation space).

A power converter that uses an AC voltage or DC voltage to produce an AC voltage, the frequency and amplitude of which are varied, is referred to as a converter (e.g., an inverter). Converters are often designed as AC/DC-DC/AC converters or DC/AC converters, where an output AC voltage is generated from an input AC voltage or an input DC voltage via a DC voltage intermediate circuit and clocked semiconductors.

Laid-open specification JP 11284125 A discloses a multilayer structure that has a pressure application plate and a support plate on both sides. The plates are provided with radial projections around which elastic insulating tapes, which connect the two plates, are stretched. When pressure is applied by screwing a bolt, the diameter of the tape decreases. A cup spring is arranged between the two plates that are pressed together when pressure is applied.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a solution for connecting electrical modules, such as power modules, to a heat sink in a weight-saving manner and with minimal installation space is provided.

According to the present embodiments, electrical modules are pressed onto a heat sink via tear- and creepage-resistant clamping elements, such as cables, cords, ropes, or straps, that pass through leadthroughs (e.g., openings) in the form of, for example, eyelets or deflection rollers on the electrical modules and the cooling surface of the heat sink.

Highly uniform pressing of the electrical module onto the cooling surface may be achieved by way of suitable selection of the arrangement of the leadthroughs on both contact partners. The leadthroughs on the electrical modules may be fastened, for example, to an internal frame in order to apply the force within the electrical module at specific points.

This type of pressing may be used with any electrical components, such as, for example, also with intermediate circuit capacitors, provided that there are leadthroughs on these components.

By way of suitable arrangement of the leadthroughs and the course of the clamping element, pulley blocks may be implemented in order to minimize the tensile force that has to be applied.

The present embodiments provide the following advantages: homogeneous introduction of force and therefore uniform contact pressure on electrical components; saving of a heavy clamping frame (e.g., providing lightweight construction); simplification of the clamping devices for curved contact surfaces or free-form surfaces; saving of screw points and therefore of construction volume; saving of pressure compensation materials; and a clamping system that may be used in a flexible manner.

The present embodiments include an arrangement including at least one electrical module that is arranged on a heat sink. The arrangement also has first deflection elements that are formed in or on the electrical module, second deflection elements that are formed in or on the heat sink, and at least one flexible, rope- or strip-like clamping element that is arranged between the first deflection elements and the second deflection elements under tension such that the electrical module is pressed onto the heat sink.

In one development, the electrical module may be an electrical component or a power module with power semiconductors.

In a further refinement, the first deflection elements and the second deflection elements are an opening, an eyelet, a leadthrough, or a deflection roller.

In a further embodiment, the clamping element is a clamping band, a clamping strap, a clamping belt, a rope, or a cable.

In one development, the clamping element may be wound a plurality of times around the first deflection elements and the second deflection elements such that a pulley block is formed. As a result, higher contact pressures may be generated.

In a refinement, the arrangement has a first fastening point that is formed on or in the heat sink, and a second fastening point in order to hold the clamping element under tension.

The present embodiments also include a power converter (e.g., a converter) including an arrangement according to the present embodiments.

The present embodiments also include an aircraft (e.g., an airplane) including a power converter according to the present embodiments for an electric or hybrid-electric aircraft propulsion system.

The aircraft may have an electric motor that is supplied with electrical energy by the converter, and a propeller that may be set in rotation by the electric motor.

The present embodiments also include a method for producing an arrangement according to the present embodiments. The method includes providing a heat sink; providing at least one electrical module; providing at least one clamping element; placing the electrical module on the heat sink; inserting the clamping element into the deflection elements; securing one end of the clamping element in the first fastening point; clamping the clamping element such that the clamping element is under tension; and securing the other end of the clamping element, which is under tension, in the second fastening point.

DETAILED DESCRIPTION

Figure 1:
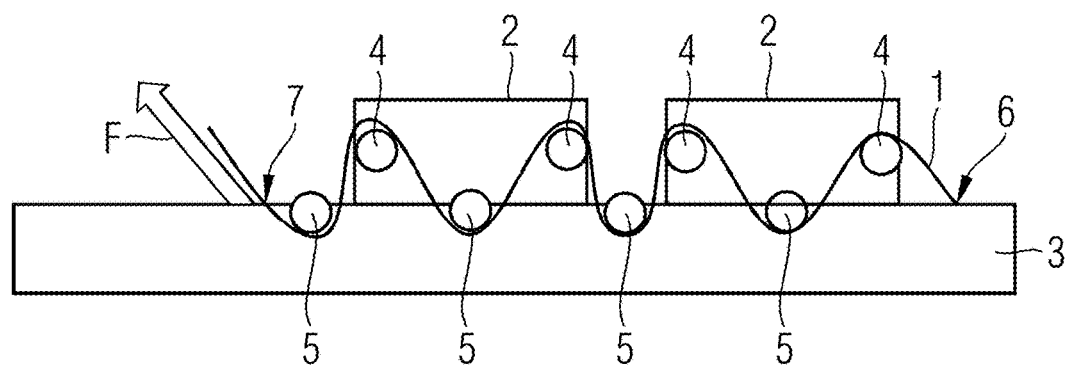
FIG. 1 shows a side view of one embodiment of an arrangement including a clamping element.

FIG. 1 shows a side view of one embodiment of an arrangement including a rope-like clamping element 1. Electrical modules 2 are arranged on a heat sink 3. Electrical modules 2 may be, for example, individual electrical/electronic components or entire electrical assemblies.

The electrical modules 2 have first deflection elements 4 that are arranged or formed laterally. With the aid of the first deflection elements 4, the clamping element 1 may be deflected. In this case, the electrical module 2 is pressed with a force-fit perpendicularly onto a surface of the heat sink 3 when the clamping element 1 is under tension. The second deflection elements 5, which are formed on or in the heat sink 3, serve as mating elements for the first deflection elements 4 and for clamping purposes.

The first deflection elements 4 and the second deflection elements 5 are spatially offset in relation to one another, so that the clamping element 1, which is under tension, presses the electrical modules 2 firmly onto the surface of the heat sink 3. To this end, the clamping element 1 is guided substantially alternately through a first deflection element 4 and a second deflection element 5.

One end of the clamping element 1 is fastened to a first fastening point 6 on the heat sink 3. The other end of the clamping element 1 is fastened to a second fastening point 7 under tension. The tension is applied by pulling the clamping element 1 in a direction of a tensile force F before the clamping element 1 is fastened to the second fastening point 7.

The first deflection elements 4 and the second deflection elements 5 may be, for example, rotatable or stationary rollers or eyelets. A pulley block effect may be generated by way of suitable arrangement of the first deflection elements 4 and the second deflection elements 5 and guidance of the clamping element 1. The clamping element 1 may be a band or a rope.

Figure 2:
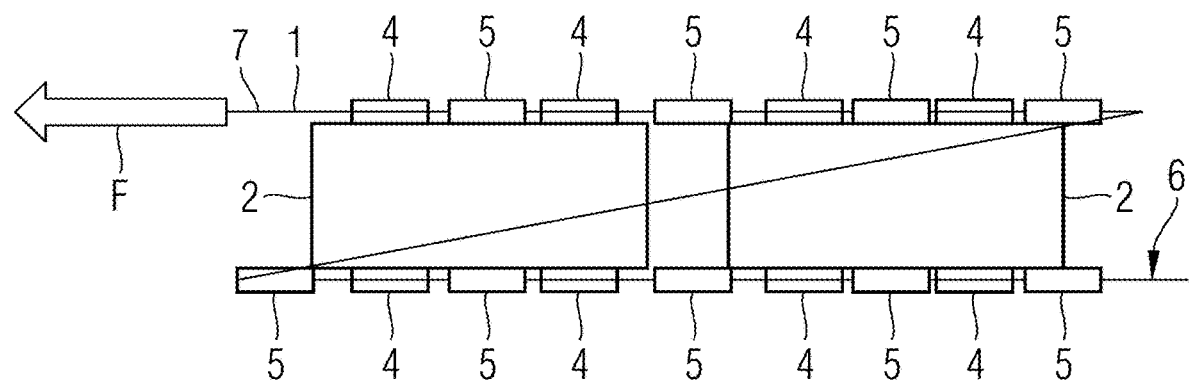
FIG. 2 shows a plan view of one embodiment of an arrangement including a clamping element.

FIG. 2 shows, in a manner corresponding to the side view of the arrangement according to FIG. 1, a view of one embodiment of an arrangement including the clamping element 1 from above.

The electrical modules 2 are arranged on the heat sink 3. The electrical modules 2 have first deflection elements 4 that are arranged or formed laterally on both sides. With the aid of the first deflection elements 4, the clamping element 1 may be deflected. In this case, the electrical modules 2 are pressed with a force-fit perpendicularly onto the surface of the heat sink 3 when the clamping element 1 is under tension (e.g., with tensile force F). The second deflection elements 5, which are formed on or in the heat sink 3, serve as mating elements for the first deflection elements 4 and for clamping purposes.

The first deflection elements 4 and the second deflection elements 5 are spatially offset in relation to one another, so that the clamping element 1, which is under tension (e.g., with tensile force F), presses the electrical modules 2 firmly onto the surface of the heat sink 3. To this end, the clamping element 1 is guided substantially alternately through a first deflection element 4 and a second deflection element 5. The clamping element 1 is guided from one side of the electrical modules 2 to the other side of the electrical modules 2, so that only a single clamping element 1 is required for securing purposes on both sides. As an alternative, a separate clamping element 1 is provided for each side.

One end of the clamping element 1 is fastened to a first fastening point 6 on the heat sink 3. The other end of the clamping element 1 is fastened to a second fastening point 7 under tension. The tension is applied by pulling the clamping element 1 in the direction of the tensile force F before the clamping element 1 is fastened to the second fastening point 7.

Figure 3:
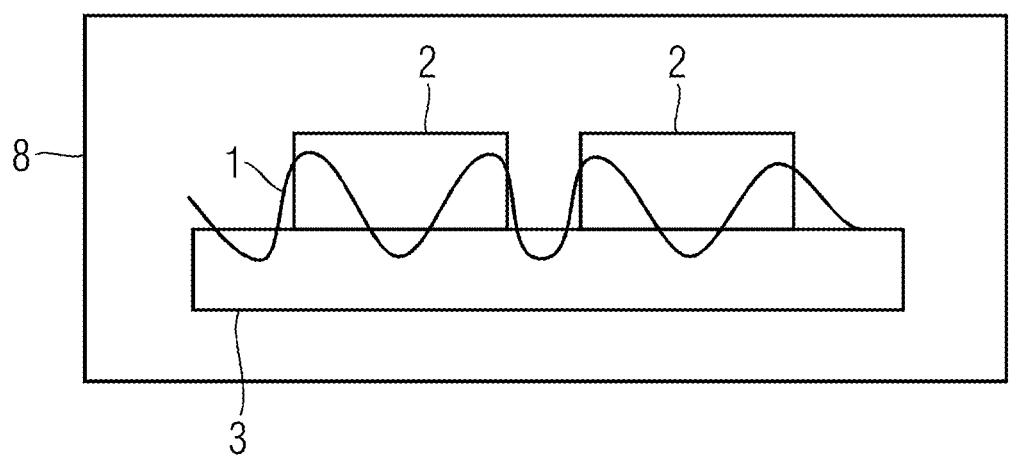
FIG. 3 shows a block diagram of one embodiment of a converter including an arrangement including a clamping element.

FIG. 3 shows a block diagram of one embodiment of a converter 8 including an arrangement including a clamping element 1 according to FIG. 1 and FIG. 2. The converter 8 has electrical modules 2 that are pressed onto the surface of the heat sink 3 with the aid of the clamping element 1. In one embodiment, the converter 8 is a power converter.

Figure 4:
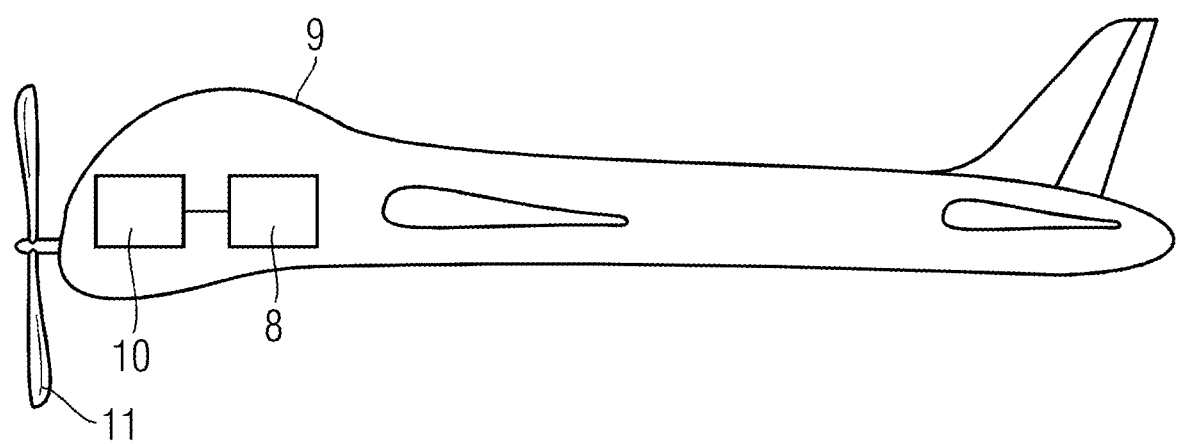
FIG. 4 shows one embodiment of an aircraft including an electric aircraft propulsion system.

FIG. 4 shows one embodiment of an electric or hybrid-electric aircraft 9 (e.g., an airplane) including a converter 8 that supplies an electric motor 10 with electrical energy. The electric motor 10 drives a propeller 11.

Although the invention has been described and illustrated more specifically in detail using the exemplary embodiments, the invention is not restricted by the disclosed examples; other variations may be derived therefrom by a person skilled in the art without departing from the scope of protection of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. An arrangement comprising:
a heat sink;
an electrical module that is arranged on the heat sink;
first deflection elements that are formed in or on the electrical module;
second deflection elements that are formed in or on the heat sink; and
a clamping element that is flexible and rope- or strip-like, the clamping element being arranged between the first deflection elements and the second deflection elements under tension such that the electrical module is pressed onto the heat sink,
wherein the clamping element is wound at least partially around each of the first deflection elements and the second deflection elements such that a pulley block is formed.

2. The arrangement of claim 1, wherein the electrical module is an electrical component or a power module with power semiconductors.

3. The arrangement of claim 1, wherein the first deflection elements and the second deflection elements are an opening, an eyelet, a leadthrough, or a deflection roller.

4. The arrangement of claim 1, wherein the clamping element is a clamping band, a clamping strap, a clamping belt, a rope, or a cable.

5. The arrangement of claim 1, further comprising:
a first fastening point that is formed on or in the heat sink; and
a second fastening point,
wherein the first fastening point and the second fastening point are configured to hold the clamping element under tension.

6. A power converter comprising:
an arrangement comprising:
a heat sink;
an electrical module that is arranged on the heat sink;
first deflection elements that are formed in or on the electrical module;
second deflection elements that are formed in or on the heat sink; and
a clamping element that is flexible and rope- or strip-like, the clamping element being arranged between the first deflection elements and the second deflection elements under tension such that the electrical module is pressed onto the heat sink,
wherein the clamping element is wound at least partially around each of the first deflection elements and the second deflection elements such that a pulley block is formed.

7. The power converter of claim 6, wherein the electrical module is an electrical component or a power module with power semiconductors.

8. The power converter of claim 6, wherein the first deflection elements and the second deflection elements are an opening, an eyelet, a leadthrough, or a deflection roller.

9. The power converter of claim 6, wherein the clamping element is a clamping band, a clamping strap, a clamping belt, a rope, or a cable.

10. An aircraft comprising:
a power converter for an electric or hybrid-electric aircraft propulsion system, the power converter comprising:
an arrangement comprising:
a heat sink;
an electrical module that is arranged on the heat sink;
first deflection elements that are formed in or on the electrical module;
second deflection elements that are formed in or on the heat sink; and
a clamping element that is flexible and rope- or strip-like, the clamping element being arranged between the first deflection elements and the second deflection elements under tension such that the electrical module is pressed onto the heat sink,
wherein the clamping element is wound at least partially around each of the first deflection elements and the second deflection elements such that a pulley block is formed.

11. The aircraft of claim 10, wherein the aircraft is an airplane.

12. The aircraft of claim 11, further comprising:
an electric motor that is supplied with electrical energy by the power converter; and
a propeller that is settable in rotation by the electric motor.

13. The aircraft of claim 10, wherein the clamping element is a clamping band, a clamping strap, a clamping belt, a rope, or a cable.

14. The aircraft of claim 10, wherein the arrangement further comprises:
a first fastening point that is formed on or in the heat sink; and
a second fastening point,
wherein the first fastening point and the second fastening point are configured to hold the clamping element under tension.

15. A method for producing an arrangement the method comprising:
providing a heat sink;
providing an electrical module;
providing a clamping element;
placing the electrical module on the heat sink;
threading the clamping element into first deflection elements and second deflection elements;
securing one end of the clamping element in a first fastening point that is formed on or in the heat sink;
clamping the clamping element such that the clamping element is under tension; and
securing the other end of the clamping element, which is under tension, in a second fastening point.

* * * * *